US006985382B2

(12) United States Patent
Fulkerson et al.

(10) Patent No.: US 6,985,382 B2
(45) Date of Patent: Jan. 10, 2006

(54) BRIDGE-TYPE MAGNETIC RANDOM ACCESS MEMORY (MRAM) LATCH

(75) Inventors: David E. Fulkerson, Plymouth, MN (US); Yong Lu, Rosemount, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/973,720

(22) Filed: Oct. 26, 2004

(65) Prior Publication Data

US 2005/0088876 A1    Apr. 28, 2005

Related U.S. Application Data

(63) Continuation of application No. 10/775,582, filed on Feb. 10, 2004, now Pat. No. 6,865,106, which is a continuation of application No. 10/246,245, filed on Sep. 17, 2002, now Pat. No. 6,714,441.

(51) Int. Cl.
    *G11C 11/00*    (2006.01)
(52) U.S. Cl. ..................................................... 365/158
(58) Field of Classification Search ................ 365/158, 365/157, 154, 100, 74, 104
    See application file for complete search history.

(56) References Cited

U.S. PATENT DOCUMENTS

| 3,573,485 A | 4/1971 | Ballard |
| 4,132,904 A | 1/1979 | Harai |
| 4,470,873 A | 9/1984 | Nakamura |
| 4,751,677 A | 6/1988 | Daughton et al. |
| 4,887,236 A | 12/1989 | Schloemann |
| 5,595,830 A | 1/1997 | Daughton |
| 5,640,343 A | 6/1997 | Gallagher et al. |
| 5,650,887 A | 7/1997 | Dovek et al. |
| 5,650,958 A | 7/1997 | Gallagher et al. |
| 5,654,566 A | 8/1997 | Johnson |
| 5,695,864 A | 12/1997 | Slonczewski |
| 5,701,222 A | 12/1997 | Gill et al. |
| 5,701,223 A | 12/1997 | Fontana, Jr. et al. |

(Continued)

FOREIGN PATENT DOCUMENTS

EP    0293231 A2    11/1988

(Continued)

OTHER PUBLICATIONS

Daughton, James M., "Advanced MRAM Concepts" Feb. 7, 2001 *NVE Cooperation* retrieved from the Internet: <URL: www.nve.com/otherbiz/mram.pdf> retrieved on Jan. 25, 2002.

(Continued)

*Primary Examiner*—Thong Q. Le
(74) *Attorney, Agent, or Firm*—Knobbe, Martens, Olson & Bear, LLP

(57) ABSTRACT

A technique to read a stored state in a magnetoresistive random access memory (MRAM) device, such as a giant magneto-resistance (GMR) MRAM device or a tunneling magneto-resistance (TMR) device uses a bit line in an MRAM device that is segmented into a first portion and a second portion. An interface circuit compares the resistance of a first portion and a second portion of a first bit line to the resistance of a first portion and a second portion of a second bit line to determine the logical state of a cell in the first bit line. The interface circuit includes a reset circuit that selectively couples the outputs of the interface circuit together. A subsequent decoupling of the outputs allows cross-coupling within the interface circuit to latch the outputs to a logical state corresponding to the stored magnetic state, thereby allowing the stored state of a cell to be read.

19 Claims, 6 Drawing Sheets

U.S. PATENT DOCUMENTS

| | | | |
|---|---|---|---|
| 5,861,328 | A | 1/1999 | Tehrani et al. |
| 5,920,500 | A | 7/1999 | Tehrani et al. |
| 6,147,922 | A | 11/2000 | Hurst, Jr. et al. |
| 6,175,525 | B1 | 1/2001 | Fulkerson et al. |
| 6,269,027 | B1 | 7/2001 | Hurst et al. |
| 6,317,359 | B1 | 11/2001 | Black et al. |
| 6,343,032 | B1 | 1/2002 | Black et al. |
| 6,392,924 | B1 | 5/2002 | Liu et al. |
| 6,493,259 | B1 | 12/2002 | Swanson et al. |
| 6,515,895 | B2 | 2/2003 | Naji |
| 6,542,000 | B1 | 4/2003 | Black et al. |
| 6,693,826 | B1 | 2/2004 | Black, Jr. et al. |
| 6,714,441 | B1 * | 3/2004 | Fulkerson et al. .......... 365/158 |
| 6,724,654 | B1 | 4/2004 | Swanson et al. |
| 6,865,106 | B2 | 3/2005 | Fulkerson et al. |
| 2002/0064067 | A1 | 5/2002 | Inui |

FOREIGN PATENT DOCUMENTS

| | | | |
|---|---|---|---|
| EP | 0776011 | A2 | 5/1997 |
| EP | 1326255 | A2 | 7/2003 |
| EP | 1326255 | A3 | 6/2004 |
| WO | WO9820496 | | 5/1998 |
| WO | WO9953499 | A1 | 10/1999 |

OTHER PUBLICATIONS

Lee, et al., "Separation of Contributions to Spin Valve Interlayer Exchange Coupling Field by Temperature Dependent Coupling Field Measurements" [online] *46th MMM Conference* Seattle, Washington 2001 pp. 1-16 [retrieved on Jan. 25, 2002] Retrieved from the Internet: <URL:www.andrew.cmu.edu/~zlee/mmm.pdf>.

"Magnetoelectronics" [online] [retrieved on Jan. 25, 2002] Retrieved from the Internet: <URL: www.lpm.virginia.edu/research/PVD/Pubs/thesis7/chapter2.PDF> Chapter 2 pp. 7-34.

"Non-Volatile Memory (MRAM)" *ANXXX* [online] Honeywell <retrieved on Nov. 19, 2001> <URL: www.ssec.honeywell.com/avionics/h_gmr.pdf> pp. 1-4.

\* cited by examiner

BRIDGE-TYPE MAGNETIC RANDOM ACCESS MEMORY (MRAM) LATCH

RELATED APPLICATIONS

This application is a continuation application of U.S. application Ser. No. 10/775,582, filed on Feb. 10, 2004, now U.S. Pat. No. 6,865,106, issued on Mar. 8, 2005, which is a continuation of U.S. application Ser. No. 10/246,245, filed Sep. 17, 2002, now U.S. Pat. No. 6,714,441, issued on Mar. 30, 2004, the disclosures of which are hereby incorporated by reference in their entirety herein.

GOVERNMENT RIGHTS

This invention was made with Government support under Contract Number MDA972-98-C-0021 awarded by DARPA. The Government has certain rights in the invention.

BACKGROUND OF THE INVENTION

1. Field of the Invention

The invention generally relates to memory technology. In particular, the invention relates to non-volatile magnetic memory.

2. Description of the Related Art

Computers and other digital systems use memory to store programs and data. A common form of memory is random access memory (RAM). Many memory devices, such as dynamic random access memory (DRAM) devices and static random access memory (SRAM) devices, are volatile memories. A volatile memory loses its data when power is removed. For example, after a conventional personal computer is powered off, the volatile memory is reloaded upon a boot up. In addition, certain volatile memories, such as DRAM devices, require periodic refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM), electrically erasable PROM (EEPROM), flash memory, and the like. Disadvantageously, conventional nonvolatile memories are relatively large, slow, and expensive. Further, many types of conventional semiconductor nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetoresistive random access memory (MRAM). An MRAM device uses magnetic states to retain data in its memory cells. Advantageously, MRAM devices are relatively fast, are nonvolatile, consume relatively little power, and do not suffer from a write cycle limitation. There are at least three different types of MRAM devices, including giant magneto-resistance (GMR) MRAM devices, magnetic tunnel junction (MTJ) or tunneling magneto-resistance (TMR) MRAM devices, and pseudo spin valve (PSV) MRAM devices. GMR MRAM devices separate at least two ferromagnetic layers with a metallic layer. In a MTJ MRAM device, at least two ferromagnetic layers are separated by a thin insulating tunnel barrier. A PSV MRAM device uses an asymmetric sandwich of the ferromagnetic layers and metallic layer as a memory cell, and the ferromagnetic layers are driven so that they do not switch at the same time.

An interface circuit detects and latches the memory state of a magnetic memory cell so that the contents of the cell can be provided to another circuit, such as a central processing unit (CPU). Disadvantageously, conventional circuits that latch the state of the magnetic memory cell are relatively sensitive to variations in transistor parameters, such as gate length. These sensitivities can disadvantageously increase production costs and can also cause data to be incorrectly read from the magnetic memory cell. Embodiments of the invention solve these and other problems by providing a latching circuit that is relatively less sensitive to variations in transistor parameters.

SUMMARY OF THE INVENTION

The invention relates to techniques to read a stored state in a magnetoresistive random access memory (MRAM) memory device. Advantageously, an interface circuit or latching circuit according to an embodiment of the invention is relatively insensitive to transistor parameter variations, such as gate length. This advantageously allows the interface circuit to be manufactured less expensively and also allows the interface circuit to reliably detect logic states with relatively small differences in resistance.

A bit line in an MRAM device is segmented into a first portion and a second portion. An interface circuit compares the resistance associated with a first portion and a second portion of a first bit line to the resistance associated with a first portion and a second portion of a second bit line to determine the logical state of a cell in the first bit line. The interface circuit includes a reset circuit to allow the circuit to achieve a balanced state by coupling outputs of the interface circuit to a relatively low resistance. Decoupling of the outputs allows cross-coupling within the interface circuit to latch the outputs to a logical state corresponding to the stored magnetic state, thereby allowing the stored state of a cell to be read.

One embodiment according to the invention includes an MRAM memory latching circuit that includes a reset circuit, a first n-type transistor, a second n-type transistor, a first p-type transistor, and a second p-type transistor. The memory latching circuit can be used to latch the stored state of a corresponding memory cell and can also be used as an interface between the memory cell and another device, such as a central processing unit (CPU). The reset circuit includes a first terminal, a second terminal, and a third terminal. The reset circuit couples the second terminal to the third terminal in response to a first state of an input signal applied to the first terminal, and the reset circuit decouples the second terminal from the third terminal in response to a second state of the input signal applied to the first terminal. Coupling of the second terminal to the third terminal effectively disables cross-coupled feedback across the memory latching circuit. The first n-type transistor includes a source coupled to a first portion of a first bit line. The second n-type transistor includes a source coupled to a first portion of a second bit line. The first p-type transistor includes a source coupled to a second portion of the second bit line, where a drain of the first p-type transistor is coupled to a drain of the first n-type transistor and to a first output. A gate of the first p-type transistor is coupled to a gate of the first n-type transistor, to a drain of a second n-type transistor, to a drain of a second p-type transistor, and to the second terminal of the reset circuit. The second p-type transistor includes a source coupled to a second portion of the first bit line, where the drain of the second p-type transistor is coupled to the drain of the second n-type transistor and to a second output. A gate of the second p-type transistor is coupled to a gate of the second n-type transistor, to the drain of the first n-type transistor, to the drain of the first p-type transistor, and to the third terminal of the reset circuit. In one embodiment, the transistors are metal-oxide semiconductor field-effect transistors (MOSFETs).

Another embodiment according to the invention includes an MRAM latching circuit. The latch includes a first terminal adapted to couple to a first portion of a first bit line, a second terminal adapted to couple to a second portion of the first bit line, a third terminal adapted to couple to a first portion of a second bit line, and a fourth terminal adapted to couple to a second portion of the second bit line. The memory latching circuit further includes an input terminal adapted to receive a reset signal, where a first state of the reset signal couples a first output to a second output, and where a second state of the reset signal decouples the first output from the second output so that the first output and the second output latch in opposite directions in response to an imbalance in resistance between the first bit line and the second bit line.

Another embodiment according to the invention includes a bit line in an MRAM. The bit line includes a first portion and a second portion coupled to magnetically sensitive resistors. The first portion is adapted to couple to a voltage source and to an interface circuit. The second portion is adapted to couple to a voltage reference (e.g., ground) and to the interface circuit. The first portion is electrically connected to the second portion through the interface circuit. In one embodiment, the first portion and the second portion contain about the same number of magnetically sensitive resistors.

Another embodiment according to the invention includes an MRAM device. The MRAM device includes a plurality of word lines and a plurality of bit lines. A bit line in the plurality of bit lines is coupled to a first portion of magnetically sensitive resistors and is also coupled to a second portion of magnetically sensitive resistors. A memory state of a cell in the MRAM device can be determined by passing a first current through a corresponding word line and a second current through at least one corresponding bit line. Where the MRAM device is a GMR, a corresponding bit line is lower in resistance when a magnetic field in a hard layer of the cell is aligned with a field induced by the first current and the second current than when the magnetic field is not aligned. The number of resistors coupled to first portions and second portions of bit lines can be the same. In one embodiment, at least one pair of bit lines is coupled to a different number of resistors in the corresponding first portion and second portion than another pair of bit lines.

One embodiment according to the invention includes a method of determining a magnetic state in an MRAM cell. The method includes applying a reset signal to an interface circuit such that at least one output of the interface circuit is reset to a balanced state, removing the reset signal, comparing an amount of resistance associated with a first portion of a first bit line to an amount of resistance associated with a first portion of a second bit line, comparing an amount of resistance associated with a second portion of the first bit line to an amount of resistance associated with a second portion of the second bit line, and generating an output with a logic state corresponding to the magnetic state stored in the cell based on the comparisons.

Another embodiment according to the invention includes a method of latching a magnetic state in an MRAM cell, such as a GMR cell. The method includes applying current to a word line corresponding to the MRAM cell. In a reset state, the method includes neutralizing cross-coupled feedback of an interface circuit to allow the interface circuit to balance in response to current applied through first and second portions of a first bit line and through first and second portions of a second bit line, where the current applied to the first bit line and the current applied through the second bit line are substantially equal, and where the first bit line corresponds to the MRAM cell. In a latched state, the method includes enabling cross-coupled feedback across the interface circuit that allows an imbalance in resistance from a stored state of the cell to latch the cell in a corresponding logical state.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

A magnetoresistive random access memory (MRAM) stores data in magnetic states of its memory cells. The electrical resistance of the cell varies depending on the stored magnetic state of the cell. The stored state of the cell is detected by sensing the difference in resistance.

While illustrated in the context of giant magneto-resistance (GMR) memories, the skilled artisan will appreciate that the principles and advantages described herein are applicable to other types of magnetic memories, such as tunneling magneto-resistance (TMR) MRAMs.

Figure 1:
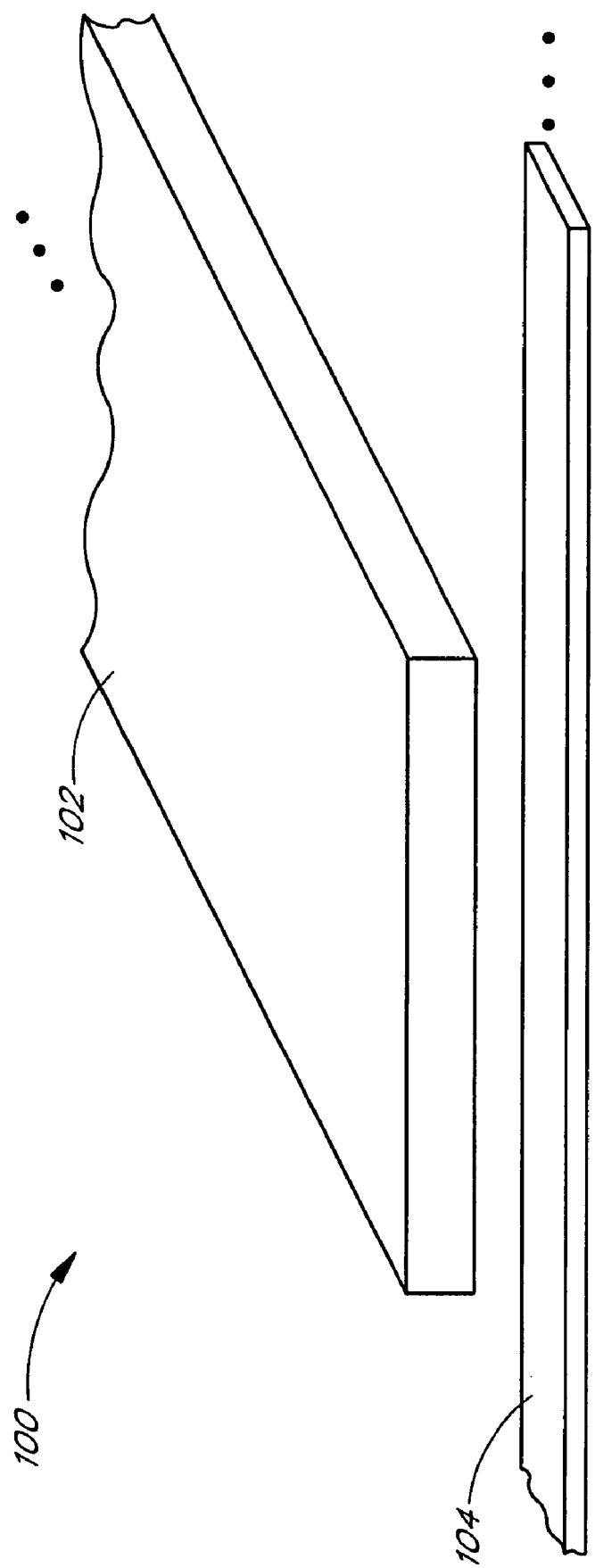
FIG. 1 is a perspective view illustrating a giant magneto-resistance (GMR) cell in a spin valve mode.

FIG. 1 is a perspective view illustrating a GMR cell 100 in a spin valve mode. The GMR cell 100 includes a word line 102 and a bit line 104. In a GMR cell, the bit line 104 is also known as a sense line. The bit line 104 contains magnetic layers. Data is stored in a cell body portion of the bit line 104 by simultaneously applying current through the word line 102 and the bit line 104. The direction of the current in the bit line 104 determines the polarization of the magnetic field that stores the logical state of the data. The polarization can be clockwise around the bit line 104 for a first state, and counterclockwise around the bit line 104 for a second state. Where the magnetic memory cell corresponds to a tunneling magneto-resistance (TMR) configuration, a TMR cell is disposed between the bit line 104 and the word line 102.

To read data from the GMR cell 100, currents are again applied to the word line 102 and the bit line 104 corresponding to the GMR cell 100. The resistance encountered by the current applied to the bit line 104 varies depending on the logical state stored in the magnetic layers. A cell with a larger resistance exhibits a larger voltage drop in response to the current than a cell with a smaller resistance.

Figure 2:
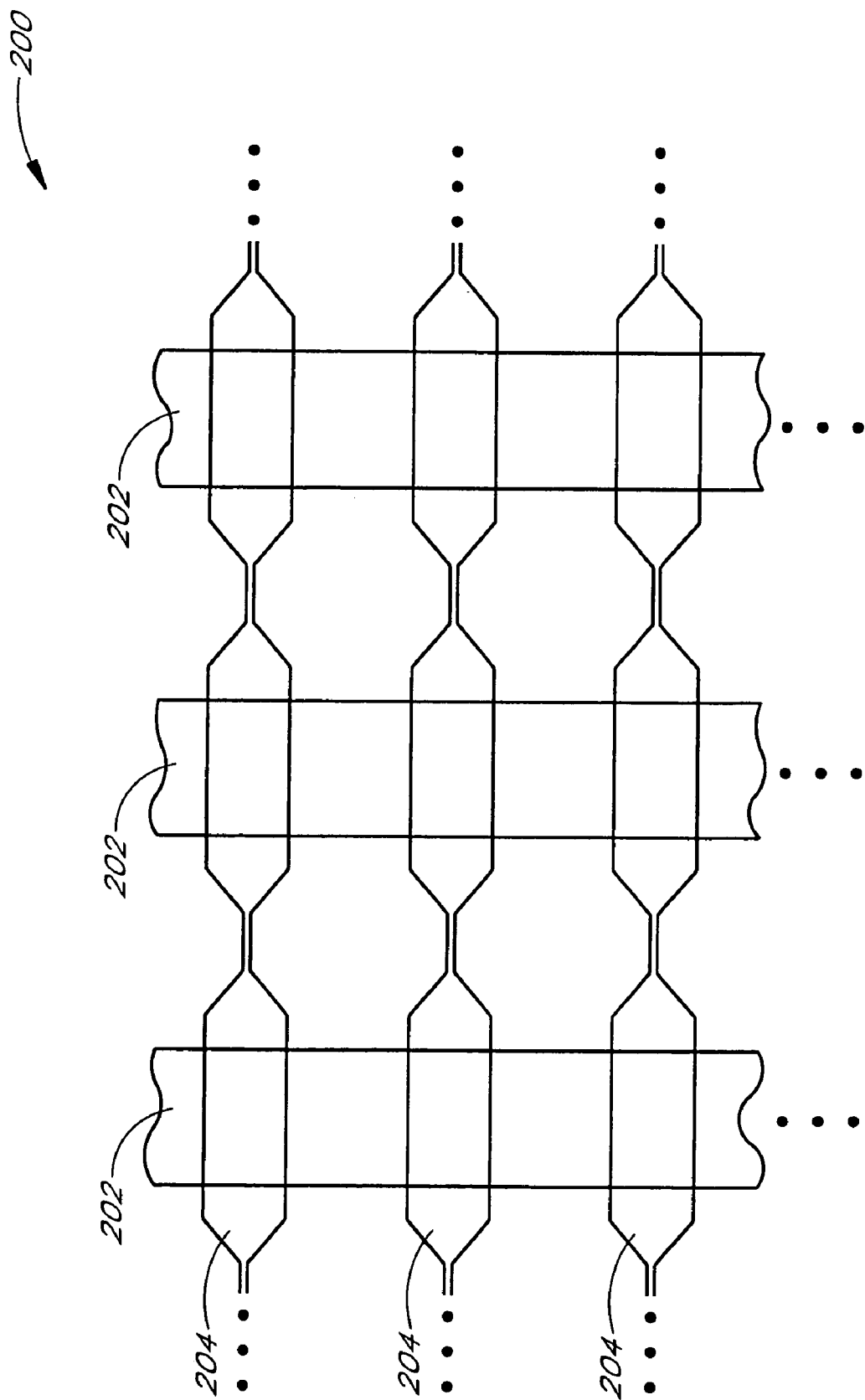
FIG. 2 is a schematic top-down view illustrating an array of GMR cells.

FIG. 2 is a schematic top-down view illustrating an array 200 of GMR cells. A plurality of cells are arranged into the array 200 in a memory device. The array 200 of cells includes a plurality of word lines 202 and a plurality of bit lines 204. An individual cell within the array 200 is selected by applying current through the corresponding word line and the corresponding bit line. Data is not stored or read in a cell where current flows through only one of the cell's word line or bit line. Thus, data is only stored in a cell where the applied word line current and the applied bit line current intersect (i.e., both currents are present at the same cell).

Figure 3:
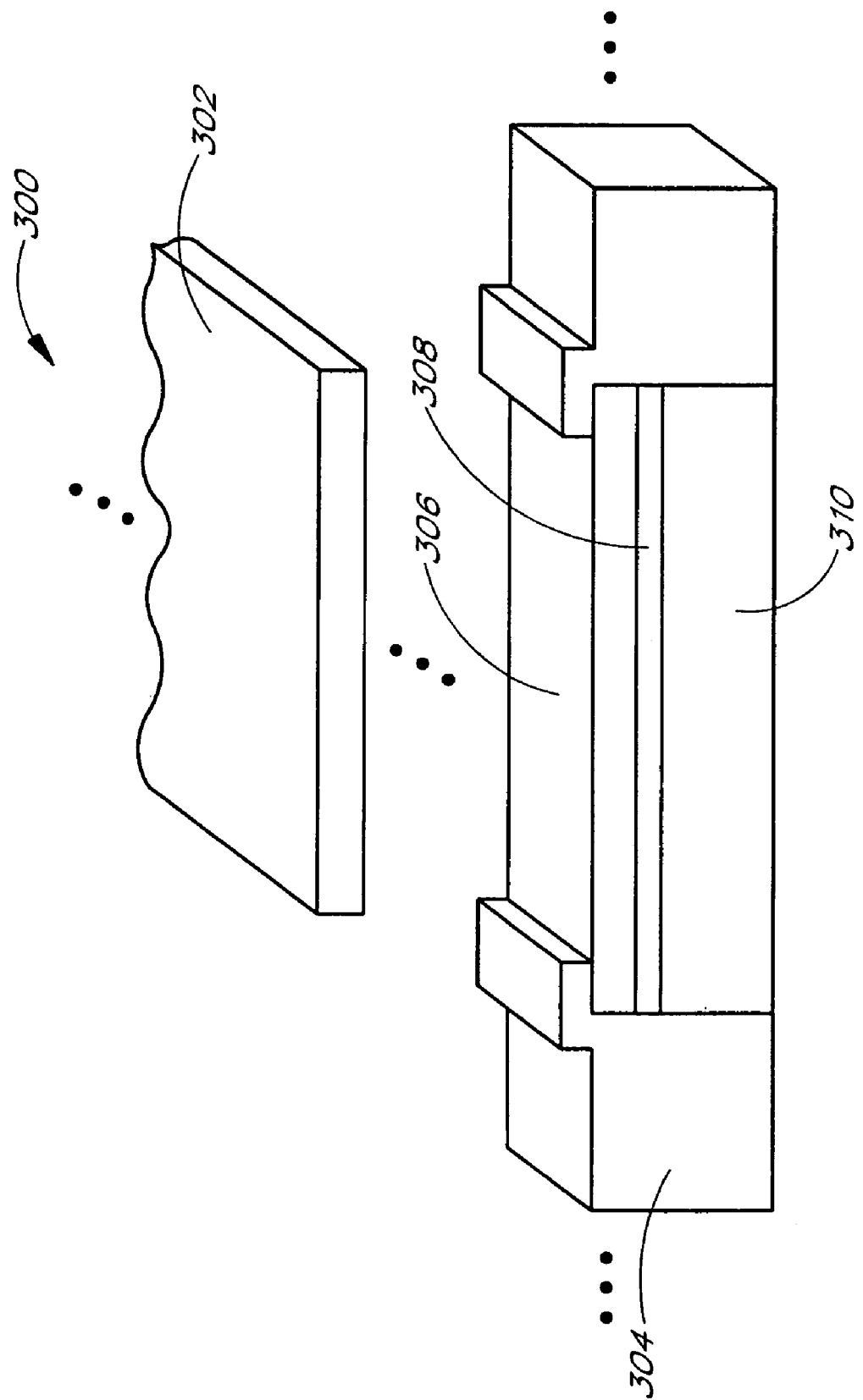
FIG. 3 illustrates a GMR cell in a pseudo spin valve (PSV) mode.

FIG. 3 illustrates a GMR cell 300 in a pseudo spin valve (PSV) mode. The GMR cell 300 includes a word line 302 and a bit line 304. The bit line 304 of the GMR cell 300, which is also known as a sense line, further includes a first magnetic layer 306, a conductive layer 308, and a second magnetic layer 310. The first magnetic layer 306 and the second magnetic layer 310 are mismatched so that the first magnetic layer 306 is magnetically "softer" than the second magnetic layer 310. The mismatch in magnetic properties can be obtained by making the first magnetic layer 306 relatively thin as compared to the second magnetic layer 310, by selecting a relatively soft magnetic material for the first magnetic layer 306 and a relatively hard magnetic material for the second magnetic layer 310, or by making the first magnetic layer 306 thinner and magnetically softer than the second magnetic layer 310.

The GMR cell 300 stores the logical state in the second magnetic layer 310. A relatively high magnetic field is required to switch the magnetization of the second magnetic layer 310. The magnetization of the second magnetic layer 310 is read by switching the magnetization of the first magnetic layer 306, which can be switched with a relatively low magnetic field generated by applying currents to the corresponding word line 302 and the corresponding bit line 304. The resulting magnetization of the first magnetic layer 306 is either parallel or anti-parallel to the magnetization of the second magnetic layer 310, which stores the state. When the magnetization in the first magnetic layer 306 is relatively aligned with or in parallel with the magnetization of the second magnetic layer 310, the electrical resistance of the GMR cell 300 is lower than when the magnetization of the first magnetic layer 306 is relatively not aligned with or is anti-parallel to the magnetization of the second magnetic layer 310. In one embodiment, current is applied in the word line 302 in both directions to peruse the magnetization of the second magnetic layer 310. The difference in electrical resistance of the bit line 304 is then sensed, thereby allowing the stored logical state of the GMR cell 300 to be retrieved. In a TMR memory cell, a cell body is formed between the bit line and the word line, and the conductive layer 308 is replaced by a relatively thin insulating layer, which is thin enough to allow the tunneling of electrons from one magnetic layer to the other magnetic layer to detect memory states.

Figure 4:
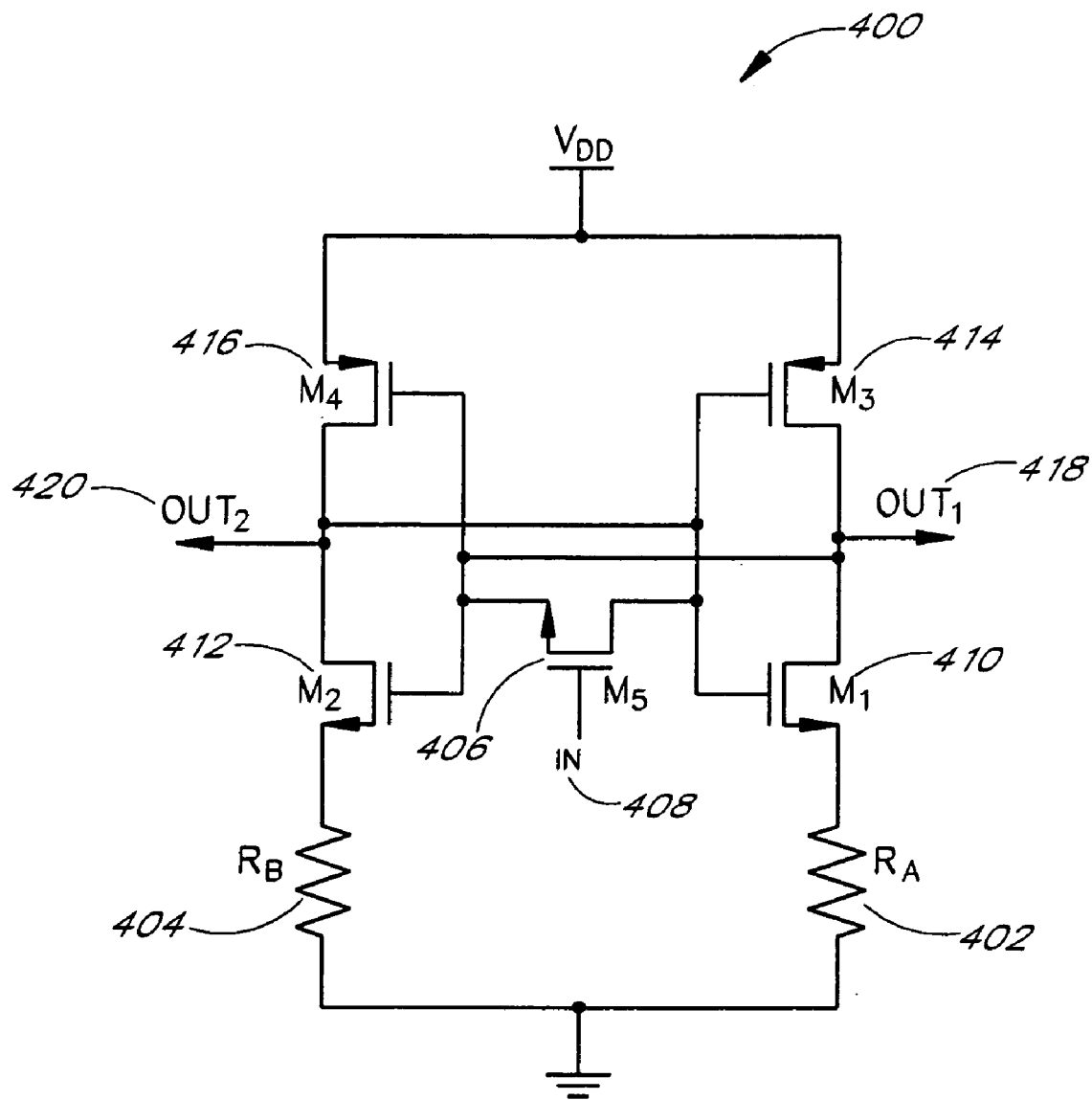
FIG. 4 illustrates a conventional latching circuit.

FIG. 4 illustrates a conventional latching circuit 400. The conventional latching circuit 400 is disadvantageously relatively sensitive to transistor parameter variations, such as gate length. The conventional latching circuit 400 detects a logic state by comparing the resistance of a first magnetically sensitive resistor $R_A$ 402, with the resistance of a second magnetically sensitive resistor $R_B$ 404. Although the first magnetically sensitive resistor $R_A$ 402 and the second magnetically sensitive resistor $R_B$ 404 are schematically illustrated with a single resistor symbol, the first magnetically sensitive resistor $R_A$ 402 and the second magnetically sensitive resistor $R_B$ 404 correspond to a combination of multiple resistances from a bit line or a sense line that corresponds to multiple memory cells in an array.

The resistance of the first magnetically sensitive resistor $R_A$ 402, the resistance of the second magnetically sensitive resistor $R_B$ 404, or the resistances of both resistors can vary depending on the stored state of the selected memory cell, which is the cell corresponding to the cell at the intersection of the applied word line current and the applied bit line current.

Initially, a reset transistor $M_5$ 406 is switched "on" by providing a relatively high signal to the gate of the reset transistor $M_5$ 406 from an input terminal 408. The "on" state of the reset transistor $M_5$ 406 balances the conventional latching circuit 400 by electrically tying the gate of a first n-type transistor $M_1$ 410 to the gate of a second n-type transistor $M_2$ 412. The first n-type transistor $M_1$ 410 and the second n-type transistor $M_2$ 412 are matched. The "on" state of the reset transistor $M_5$ 406 also electrically ties the gate of a first p-type transistor $M_3$ 414 with the gate of a second p-type transistor $M_4$ 416. The first p-type transistor $M_3$ 414 and the second p-type transistor $M_4$ 416 are also matched.

To illustrate the latching operation of the conventional latching circuit 400, the operation of the conventional latching circuit 400 will now be described with the first magnetically sensitive resistor $R_A$ 402 at a lower resistance than the second magnetically sensitive resistor $R_B$ 404. When the resistance of the first magnetically sensitive resistor $R_A$ 402 is lower than the resistance of the second magnetically sensitive resistor $R_B$ 404, the source of the first n-type transistor $M_1$ 410 should be at a lower voltage relative to voltage at the source of the second n-type transistor $M_2$ 412. Since the gate of the first n-type transistor $M_1$ 410 and the gate of the second n-type transistor $M_2$ 412 are tied to the same potential, the first n-type transistor $M_1$ 410 is relatively more conductive from drain to source than the second n-type transistor $M_2$ 412 because of the larger gate to source voltage of the first n-type transistor $M_1$ 410.

To latch the conventional latching circuit 400, the reset transistor $M_5$ 406 is turned "off" by deactivating the relatively high input signal previously applied to the gate of the reset transistor $M_5$ 406 via the input terminal 408. When operating as intended, the conventional latching circuit 400 latches into an electrical state determined by the mismatch in resistance between the first magnetically sensitive resistor $R_A$ 402 and the second magnetically sensitive resistor $R_B$ 404. When the first magnetically sensitive resistor $R_A$ 402 has a lower resistance than the second magnetically sensitive resistor $R_B$ 404, the conventional latching circuit 400 should switch to a state where a first output $OUT_1$ 418 is at a "low" state and a second output $OUT_2$ 420 is at a "high" state.

When the reset transistor $M_5$ 406 is turned "off," the gates of the first n-type transistor $M_1$ 410 and the first p-type transistor $M_3$ 414 are decoupled from the gates of the second n-type transistor $M_2$ 412 and the second p-type transistor $M_4$ 416. Because the drain of the first n-type transistor $M_1$ 410 is relatively more conductive than the second n-type transistor $M_2$ 412, the voltage at the first output $OUT_1$ 418 is relatively low as compared with the voltage at the second output $OUT_2$ 420. The relatively low voltage at the first output $OUT_1$ 418 is cross-coupled to the gate of the second n-type transistor $M_2$ 412 and to the gate of the second p-type transistor $M_4$ 416. A relatively low voltage on the gate of the second n-type transistor $M_2$ 412 tends to turn the second n-type transistor $M_2$ 412 "off" (i.e., less conductive). A relatively low voltage on the gate of the second p-type transistor $M_4$ 416 tends to turn the second p-type transistor $M_4$ 416 "on" (i.e., more conductive). This causes the voltage of the second output $OUT_2$ 420 to rise.

A relatively high voltage on the second output $OUT_2$ 420 is cross-coupled to the first n-type transistor $M_1$ 410 and to the first p-type transistor $M_3$ 414. A relatively high voltage on the gate of the first n-type transistor $M_1$ 410 turns the first n-type transistor $M_1$ 410 more "on" (i.e., more conductive). A relatively high voltage on the gate of the first p-type transistor $M_3$ 414 causes the first p-type transistor $M_3$ 414 to turn "off" (i.e., less conductive). This causes the voltage of the first output $OUT_1$ 418 to go lower. The process continues until the first output $OUT_1$ 418 is at a "low" state and the second output $OUT_2$ 420 is at a "high" state.

The skilled artisan will appreciate that relatively closely matched transistors are difficult and expensive to manufacture. In addition, the magnitude of the difference in resistance between one logic state and another logic state is relatively small, e.g., a few percent. Where, for example, the drain currents of the first p-type transistor $M_3$ 414 and the second p-type transistor $M_4$ 416 are mismatched by more than the difference in resistance between logic states, the final state of the latch will be undesirably determined by the transistor mismatch rather than the stored logic state, and the logic state may not be correctly reported. The drain current in the first p-type transistor $M_3$ 414 or in the second p-type transistor $M_4$ 416 is approximately inversely proportional to the gate length, L, of the transistor. Thus, for the conventional latching circuit 400 to properly report data, the gate lengths of the first p-type transistor $M_3$ 414 and the second p-type transistor $M_4$ 416 should be matched to at least the difference in resistance between logic states.

Figure 5:
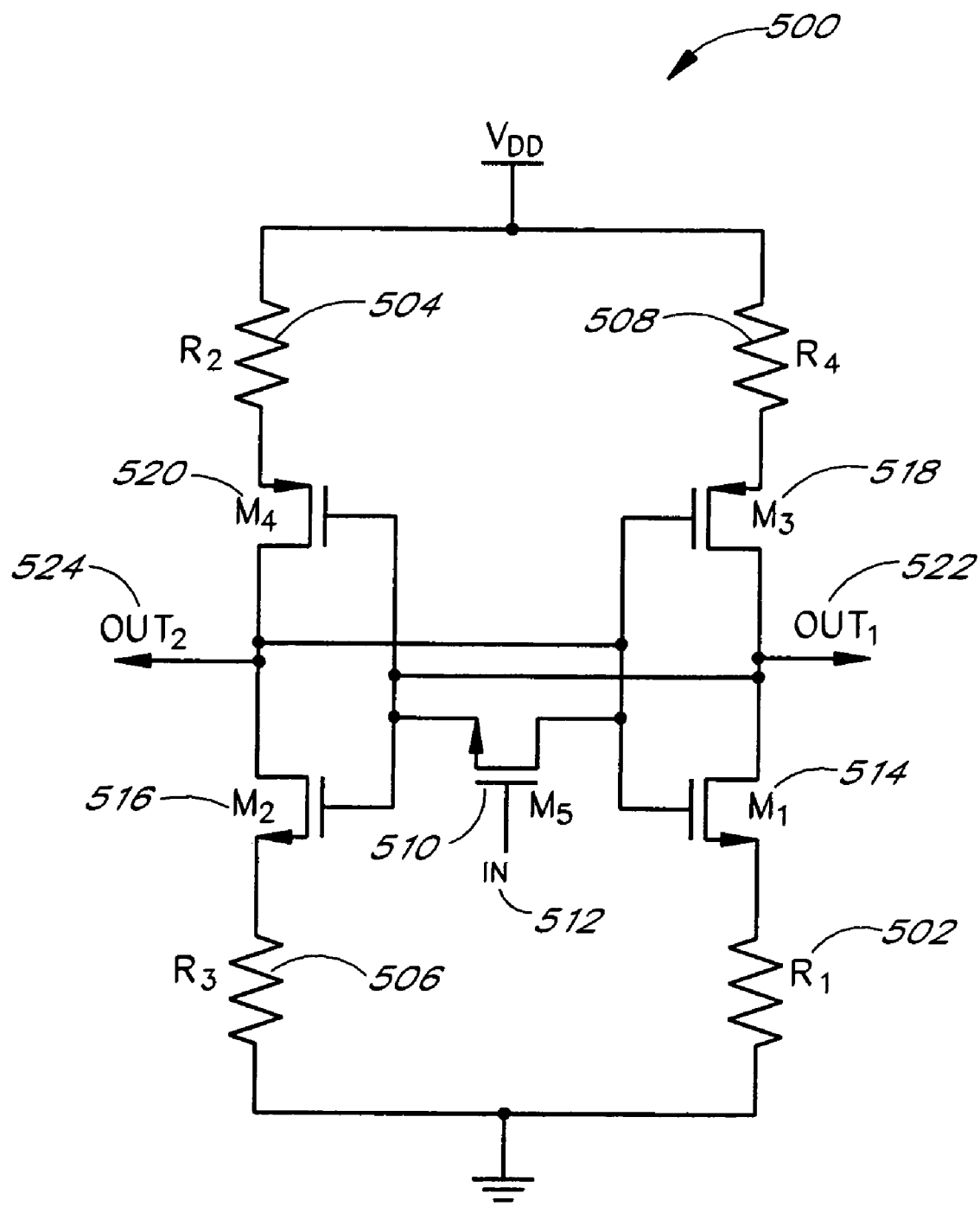
FIG. 5 illustrates a latching circuit according to an embodiment of the invention.

FIG. 5 illustrates an improved latching circuit 500 according to an embodiment of the invention. The latching circuit 500 more reliably detects logical states of magnetically sensitive resistors, such as those used in GMR and in TMR memory devices, than the conventional latching circuit 400 described above in connection with FIG. 4. The latching circuit 500 is advantageously relatively insensitive to transistor parameter variations, such as gate length. This advantageously allows the latching circuit 500 to be manufactured less expensively and also allows the latching circuit 500 to reliably detect logic states with relatively small differences in resistance.

Although the latching circuit 500 is illustrated with n-channel and p-channel metal-oxide semiconductor field-effect transistors (MOSFETs) for the n-type and p-type transistors, respectively, it will be understood by one of ordinary skill in the art that the circuit can also be implemented with other technologies. For example, silicon-germanium (Si—Ge) bipolar transistors, silicon bipolar transistors, gallium arsenide metal semiconductor field-effect transistors (GaAs FETs or MESFETs), heterojunction bipolar transistors (HBTs), Si—Ge bipolar complementary metal-oxide semiconductor (BiCMOS), and the like can also be used.

The latching circuit 500 detects a logic state by comparing the resistance of a first bit line with the resistance of a second bit line. When the magnetic cells are GMR cells, the first bit line and the second bit line include a plurality of magnetically sensitive resistors for their respective cells that are connected in series. When the magnetic cells are TMR cells, the first bit line and the second bit line carry current coupled from word lines through the TMR cells in addition to current applied to the bit line. In the illustrated latching circuit 500, the first bit line is segmented into two portions. The bit line can be segmented into more than two portions. In one embodiment, the bit line is segmented into two approximately equal portions.

A first portion of the first bit line is schematically illustrated as a first magnetically sensitive resistor $R_1$ 502, and a second portion of the first bit line is schematically illustrated as a second magnetically sensitive resistor $R_2$ 504. A first portion of the second bit line is schematically illustrated as a third magnetically sensitive resistor $R_3$ 506, and a second portion of the second bit line is schematically illustrated as a fourth magnetically sensitive resistor $R_4$ 508. It will be understood by one of ordinary skill in the art that the portions of the first bit line and the second bit line schematically illustrated by the first magnetically sensitive resistor $R_1$ 502, the second magnetically sensitive resistor $R_2$ 504, the third magnetically sensitive resistor $R_3$ 506, and the fourth magnetically sensitive resistor $R_4$ 508 include combinations of multiple magnetically sensitive resistors.

The combined resistance (i.e., the series resistance) of the first magnetically sensitive resistor $R_1$ 502 and the second magnetically sensitive resistor $R_2$ 504, the combined resistance of the third magnetically sensitive resistor $R_3$ 506 and the fourth magnetically sensitive resistor $R_4$ 508, or both combined resistances can vary depending on the stored state of the selected memory cell, which is the cell corresponding to the cell with the applied word line current and the applied bit line current.

Initially, a reset transistor $M_5$ 510 is switched "on" by providing a relatively high signal to the gate of the reset transistor $M_5$ 510 from an input terminal 512. The illustrated reset transistor $M_5$ 510 is an n-type transistor. However, the skilled practitioner will appreciate that a p-type transistor can also be used. The "on" state of the reset transistor $M_5$ 510 balances the latching circuit 500 by electrically tying the gate of a first n-type transistor $M_1$ 514, the gate of a second n-type transistor $M_2$ 516, the gate of a first p-type transistor $M_3$ 518, and the gate of a second p-type transistor $M_4$ 520 together. The first n-type transistor $M_1$ 514 and the second n-type transistor $M_2$ 516 are preferably matched to each other. The first p-type transistor $M_3$ 518 and the second p-type transistor $M_4$ 520 are also preferably matched to each other.

To illustrate the latching operation of the latching circuit 500, the operation of the latching circuit 500 will now be described with the reset transistor $M_5$ 510 switched "on" and with the combined resistance of the first magnetically sensitive resistor $R_1$ 502 and the second magnetically sensitive resistor $R_2$ 504 (i.e., the resistance of the first bit line) at a lower resistance than the combined resistance of the third magnetically sensitive resistor $R_3$ 506 and the fourth magnetically sensitive resistor $R_4$ 508 (i.e., the resistance of the second bit line).

When the combined resistance of the first magnetically sensitive resistor $R_1$ 502 and the second magnetically sensitive resistor $R_2$ 504 is lower than the combined resistance of the third magnetically sensitive resistor $R_3$ 506 and the fourth magnetically sensitive resistor $R_4$ 508, then one of the first magnetically sensitive resistor $R_1$ 502 or the second magnetically sensitive resistor $R_2$ 504 is lower in resistance than the corresponding one of the third magnetically sensitive resistor $R_3$ 506 or the fourth magnetically sensitive resistor $R_4$ 508. The other resistor in each series resistance should have about the same resistance (e.g., if the resistance of the first resistor $R_1$ 502 is lower than the resistance of the third resistor $R_3$ 506, then the resistance of the second resistor $R_2$ 504 is approximately equal to the resistance of the fourth resistor $R_4$ 508).

When the resistance of the first magnetically sensitive resistor $R_1$ 502 is lower than the resistance of the third magnetically sensitive resistor $R_3$ 506, the first n-type transistor $M_1$ 514 is relatively more conductive from drain to source than the second n-type transistor $M_2$ 516 is from drain to source because the lower resistance of the first magnetically sensitive resistor $R_1$ 502 results in a larger voltage from gate to source in the first n-type transistor $M_1$ 514 than in the second n-type transistor $M_2$ 516. When the resistance of the second magnetically sensitive resistor $R_2$ 504 is lower than the resistance of the fourth magnetically sensitive resistor $R_4$ 508, then the source of the second p-type transistor $M_4$ 520 is at a higher electrical potential than the source of the gate of the first p-type transistor $M_3$ 518. Since the gates of the second p-type transistor $M_4$ 520 and the gate of the first p-type transistor $M_3$ 518 are tied to the same potential when the reset transistor $M_5$ 510 is switched "on," the second p-type transistor $M_4$ 520 has a relatively larger source to gate voltage than the gate of the first p-type transistor $M_3$ 518. The relatively larger source to gate voltage of the second p-type transistor $M_4$ 520 as compared to the source to gate voltage of the first p-type transistor $M_3$ 518 causes the second p-type transistor $M_4$ 520 to be relatively more conductive from source to drain than the first p-type transistor $M_3$ 518.

Following the foregoing process, a relatively low signal is provided from the input terminal 512 to the gate of the reset transistor $M_5$ 510 to switch the reset transistor $M_5$ 510 to an "off" state to thereby enable the latching action of the latching circuit 500. When the reset transistor $M_5$ 510 is switched "off," the gates of the first n-type transistor $M_1$ 514 and the first p-type transistor $M_3$ 518 are decoupled from the gates of the second n-type transistor $M_2$ 516 and the second p-type transistor $M_4$ 520.

When the first n-type transistor $M_1$ 514 is relatively more conductive than the second n-type transistor $M_2$ 516, the voltage at a first output $OUT_1$ 522 is relatively low as compared with the voltage at a second output $OUT_2$ 524. The relatively low voltage at the first output $OUT_1$ 522 is cross-coupled to the gate of the second n-type transistor $M_2$ 516 and to the gate of the second p-type transistor $M_4$ 520. A relatively low voltage on the gate of the second n-type transistor $M_2$ 516 tends to turn the second n-type transistor $M_2$ 516 "off" (i.e., less conductive). A relatively low voltage on the gate of the second p-type transistor $M_4$ 520 tends to turn the second p-type transistor $M_4$ 520 "on" (i.e., more conductive). This causes the voltage at the second output $OUT_2$ 524 to rise.

A relatively high voltage on the second output $OUT_2$ 524 is cross-coupled to the first n-type transistor $M_1$ 514 and the first p-type transistor $M_3$ 518. A relatively high voltage on the gate of the first n-type transistor $M_1$ 514 turns the first n-type transistor $M_1$ 514 more "on" (i.e., more conductive). A relatively high voltage on the gate of the first p-type transistor $M_3$ 518 causes the first p-type transistor $M_3$ 518 to turn "off" (i.e., less conductive). This causes the voltage of the first output $OUT_1$ 522 to go lower. The process continues until the first output $OUT_1$ 522 is at a "low" state and the second output $OUT_2$ 524 is at a "high" state.

When the second p-type transistor $M_4$ 520 is relatively more conductive than the first p-type transistor $M_3$ 518, the voltage at the second output $OUT_2$ 524 is relatively high as compared with the voltage at the first output $OUT_1$ 522. The relatively high voltage at the second output $OUT_2$ 524 is cross-coupled to the gate of the first n-type transistor $M_1$ 514 and to the gate of the first p-type transistor $M_3$ 518. A relatively high voltage on the gate of the first n-type transistor $M_1$ 514 tends to turn the first n-type transistor $M_1$ 514 "on" (i.e., more conductive). A relatively high voltage on the gate of the first p-type transistor $M_3$ 518 tends to turn the first p-type transistor $M_3$ 518 "off" (i.e., less conductive). This causes the voltage at the first output $OUT_1$ 522 to decrease.

A relatively low voltage on the first output $OUT_1$ 522 is cross-coupled to the second n-type transistor $M_2$ 516 and to the second p-type transistor $M_4$ 520. A relatively low voltage on the gate of the second n-type transistor $M_2$ 516 turns the second n-type transistor $M_2$ 516 further "off" (i.e., less conductive). A relatively low voltage on the gate of the second p-type transistor $M_4$ 520 causes the second p-type transistor $M_4$ 520 to turn "on" (i.e., more conductive). This causes the voltage of the second output $OUT_2$ 524 to increase. The process continues until the first output $OUT_1$ 522 is at a "low" state, and the second output $OUT_2$ 524 is at a "high" state.

As illustrated above, when the combined resistance of the first magnetically sensitive resistor $R_1$ 502 and the second magnetically sensitive resistor $R_2$ 504 is less than the combined resistance of the third magnetically sensitive resistor $R_3$ 506 and the fourth magnetically sensitive resistor $R_4$ 508, the latching circuit 500 switches to a state where the first output $OUT_1$ 522 is at a "low" state, and the second output $OUT_2$ 524 is at a "high" state.

Advantageously, the latching circuit 500 is relatively less sensitive to variations in transistor parameters, such as channel length. The conventional latching circuit 400 described in connection with FIG. 4 is relatively sensitive to variations in the first p-type transistor $M_3$ 414 and the second p-type transistor $M_4$ 416. Equations 1 and 2 express a relationship of the sensitivity of the conventional latching circuit 400 to variations in channel length.

$$\frac{\Delta L}{L} = \frac{\Delta R}{R} \quad \text{(Eq. 1)}$$

$$\frac{\Delta L}{L} = \left(\frac{1}{2}\right)\left(\frac{\Delta R}{R}\right) \quad \text{(Eq. 2)}$$

Equation 1 applies when the first n-type transistor $M_1$ 410 and the second n-type transistor $M_2$ 412 are relatively large and the inverse of the transconductances, i.e., $g_m^{-1}$, of the first n-type transistor $M_1$ 410 and the second n-type transistor $M_2$ 412 are relatively small as compared to the amount of the resistance of the first magnetically sensitive resistor $R_A$ 402 or the second magnetically sensitive resistor $R_B$ 404. Equation 2 applies when the first n-type transistor $M_1$ 410 and the second n-type transistor $M_2$ 412 are relatively small, and when the inverse of the transconductance ($1/g_m$) of the first n-type transistor $M_1$ 410 and the second n-type transistor $M_2$ 412 are about the same as the resistance of the first magnetically sensitive resistor $R_A$ 402 or the resistance of the second magnetically sensitive resistor $R_B$ 404. Equations 1 and 2 illustrate that in the conventional latching circuit 400, the variability of the channel lengths of the first p-type transistor M₃ 414 and the second p-type transistor M₄ 416 should be relatively small to ensure proper detection or translation of stored data.

In contrast to the conventional latch of FIG. 4, the latching circuit 500 of FIG. 5 is relatively insensitive to variations in channel lengths of the first p-type transistor M₃ 518 and the second p-type transistor M₄ 520 because of the inclusion of the second magnetically sensitive resistor R₂ 504 and the fourth magnetically sensitive resistor R₄ 508 between the voltage source V$_{DD}$ and the respective sources of the transistors. Mismatches in transistor channel lengths are relatively small as compared to the resistances of the second magnetically sensitive resistor R₂ 504 and the fourth magnetically sensitive resistor R₄ 508, thereby allowing the latching circuit 500 to detect relatively small differences in resistance and allowing the production of the latching circuit 500 with a relatively large amount of variability in transistor parameters, such as channel lengths.

Figure 6:
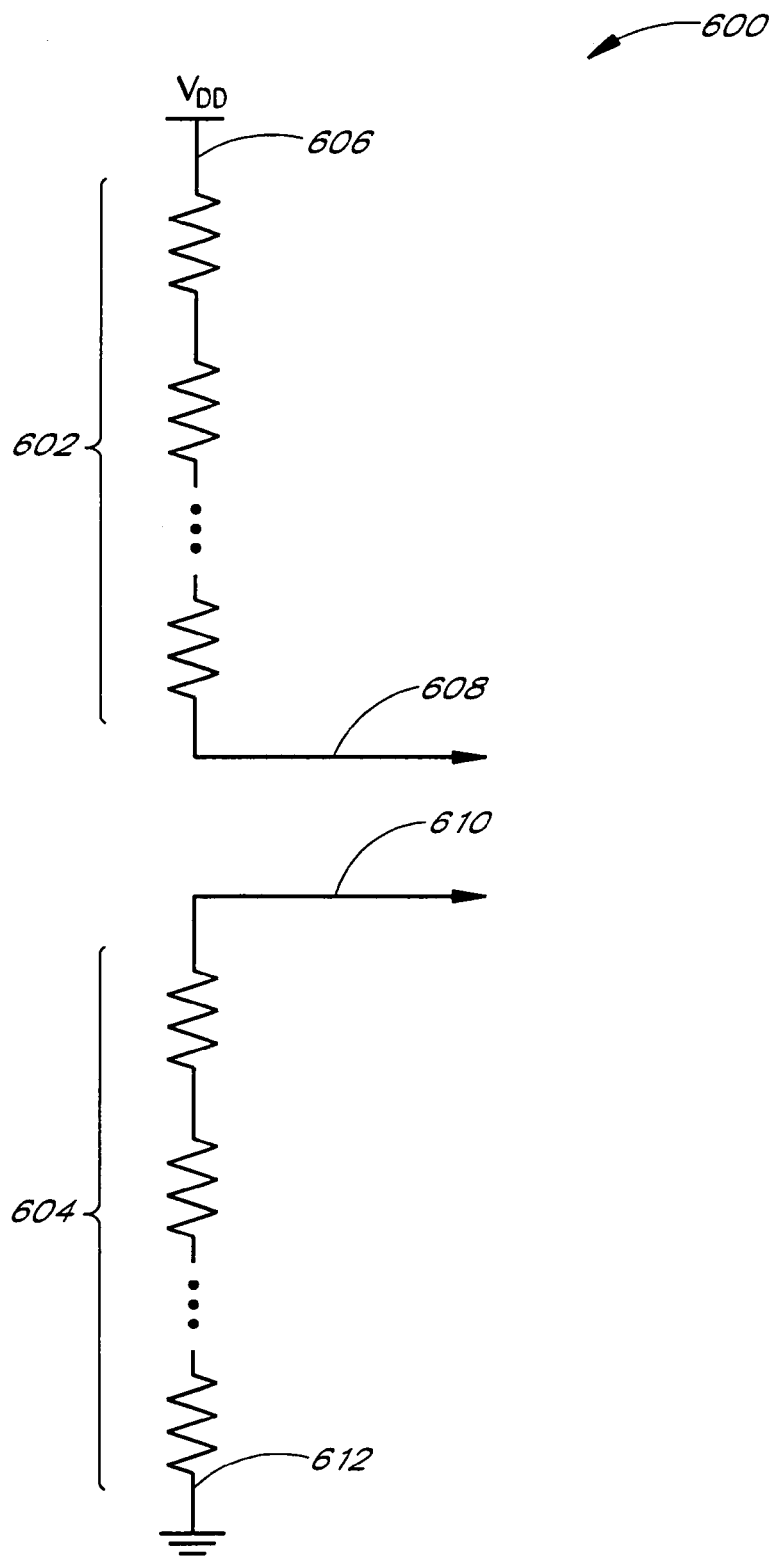
FIG. 6 is a schematic of a bit line of an array of magnetoresistive random access memory (MRAM) cells according to an embodiment of the invention.

FIG. 6 is a schematic of a bit line 600 of an array of MRAM cells according to an embodiment of the invention. The illustrated bit line 600 includes a first portion 602 and a second portion 604, and is shown in a GMR configuration. It will be understood by one of ordinary skill in the art that in a TMR configuration, a bit line can also be apportioned between a first portion and a second portion, but that the TMR cells couple to the bit line in parallel from corresponding word lines.

The first portion 602 and the second portion 604 each include a plurality of magnetically sensitive resistors that store data in magnetic states. The resistance of the first portion 602 and the resistance of the second portion 604 can vary over a broad range. The amount of resistance of the first portion 602 and the amount of resistance of the second portion 604 can be equal, but do not have to be equal. For example, one portion can have 60% of the resistance, and the other portion can have 40% of the resistance. In addition, the proportion of allocated resistance in portions of bit lines can vary within an array, although preferably not within pairs of bit lines coupled to an interface circuit. In one embodiment, the resistance of the first portion 602 and the resistance of the second portion 604 are approximately equal.

In one embodiment, the first portion 602 and the second portion 604 do not electrically connect within the array of GMR cells. The resistance of the magnetically sensitive resistors vary in accordance with the stored magnetic state and can be translated to logical states with an interface circuit, such as the latching circuit 500 described in connection with FIG. 5.

A first terminal 606 of the bit line 600 is provided to connect, either directly or indirectly, the bit line 600 to the voltage source V$_{DD}$. A second terminal 608 of the bit line 600 is provided to interface with a corresponding interface circuit, such as the latching circuit 500. A third terminal 610 of the bit line 600 is also provided to interface with the interface circuit. A fourth terminal 612 of the bit line 600 is provided to connect, either directly or indirectly, the bit line 600 to a reference voltage (e.g., ground). The illustrated configuration of the bit line 600 advantageously allows an interface circuit to be produced with a relatively large tolerance for transistor variations, such as channel lengths.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A latching circuit that senses and latches the magnetic states of a first bit line and a second bit line in a magnetoresistive random access memory (MRAM), the latching circuit comprising:
   a first n-type transistor with a gate, a drain, and a source, the source of the first n-type transistor is operatively coupled to a first portion of the first bit line;
   a second n-type transistor with a gate, a drain, and a source, the gate of the second n-type transistor is operatively coupled to the drain of the first n-type transistor, the drain of the second n-type transistor is operatively coupled to the gate of the first n-type transistor, the source of the second n-type transistor is operatively coupled to a first portion of the second bit line;
   a first p-type transistor with a gate, a drain, and a source, the gate of the first p-type transistor is operatively coupled to the gate of the first n-type transistor, the drain of the first p-type transistor is operatively coupled to the drain of the first n-type transistor, the source of the first p-type transistor is operatively coupled to a second portion of the second bit line;
   a first output operatively coupled to the drain of the first p-type transistor;
   a second p-type transistor with a gate, a drain, and a source, the gate of the second p-type transistor is operatively coupled to the gate of the second n-type transistor, the drain of the second p-type transistor is operatively coupled to the drain of the second n-type transistor, the source of the second p-type transistor is operatively coupled to a second portion of the first bit line; and
   a reset switch with a first terminal, a second terminal, and a third terminal, the first terminal is operatively coupled to an input signal, the second terminal is operatively coupled to the gate of the first n-type transistor, the third terminal is operatively coupled to the gate of the second n-type transistor, the reset switch at least partially responsive to a first state and to a second state of the input signal such that in the first state, the reset switch is configured to operatively couple the second terminal to the third terminal, and where in the second state, the reset switch is configured to operatively decouple the second terminal from the third terminal.

2. The latching circuit as defined in claim 1, further comprising a second output operatively coupled to the drain of the second n-type transistor.

3. The latching circuit as defined in claim 1, wherein the first n-type transistor and the second n-type transistor comprise n-channel metal-oxide semiconductor field-effect transistors (MOSFETs), and where the first p-type transistor and the second p-type transistor comprise p-channel MOSFETs.

4. The latching circuit as defined in claim 3, wherein the reset switch comprises an n-channel MOSFET with a gate, a drain, and a source as the first, the second, and the third terminals of the reset switch.

5. The latching circuit as defined in claim 3, wherein the reset switch comprises an n-channel MOSFET with a gate, a drain, and a source as the first, the third, and the second terminals of the reset switch.

6. The latching circuit as defined in claim 1, wherein the first n-type transistor and the second n-type transistor comprise n-channel metal-oxide semiconductor field-effect transistors (MOSFETs), and where the first p-type transistor and the second p-type transistor comprise p-channel MOSFETs.

7. The latching circuit as defined in claim 6, wherein the reset switch comprises a p-channel MOSFET with a gate, a drain, and a source as the first, the second, and the third terminals of the reset switch.

8. The latching circuit as defined in claim 6, wherein the reset switch comprises a p-channel MOSFET with a gate, a drain, and a source as the first, the third, and the second terminals of the reset switch.

9. A magnetoresistive random access memory (MRAM) interface circuit comprising:
   a first terminal adapted to couple to a first portion of a first bit line;
   a second terminal adapted to couple to a second portion of the first bit line;
   a third terminal adapted to couple to a first portion of a second bit line;
   a fourth terminal adapted to couple to a second portion of the second bit line;
   a fifth terminal adapted to receive a reset signal with a first state and a second state;
   a latch circuit with cross-coupled feedback operatively coupled to the first terminal, the second terminal, the third terminal, the fourth terminal, and the fifth terminal, where at least partially in response to the first state of the reset signal, the cross-coupled feedback latches the latch circuit in response to an imbalance in resistance between the first bit line and the second bit line, and where at least partially in response to the second state of the reset signal, the cross-coupled feedback is neutralized and the latch circuit is not latched; and
   an output terminal coupled to the latch circuit to provide an indication of the imbalance.

10. The MRAM interface circuit as defined in claim 9, further comprising a second output terminal coupled to the latch circuit, wherein the second output terminal provides an opposite indication of the imbalance when the cross-coupled feedback latches the latch circuit.

11. A bit line in a magnetoresistive random access memory (MRAM) comprising:
   a first portion having a first plurality of magnetically sensitive resistors, where the first portion is adapted to couple to a voltage source and to an interface circuit; and
   a second portion separate from the first portion, the second portion having a second plurality of magnetically sensitive resistors, where the second portion is adapted to couple to the interface circuit and to a reference voltage.

12. The bit line as defined in claim 11, wherein the reference voltage is ground.

13. The bit line as defined in claim 11, wherein the MRAM is a giant magneto-resistance (GMR) memory, the first plurality of magnetically sensitive resistors are electrically coupled in series, and the second plurality of magnetically sensitive resistors are electrically coupled in series.

14. The bit line as defined in claim 11, where the first plurality of magnetically sensitive resistors and the second plurality of magnetically sensitive resistors each comprise about one-half of the resistors of the bit line.

15. A magnetoresistive random access memory (MRAM) device comprising:
   a plurality of pairs of bit lines, wherein a bit line comprises a plurality of magnetically sensitive resistors arranged in a first group and in a second group, the second group separate from the first group, where the number of magnetically sensitive resistors in the first group and in the second group is the same within pairs of bit lines;
   a plurality of word lines configured to selectively activate magnetically sensitive resistors corresponding to a cell; and
   an interface circuit that detects a difference in resistance between the first bit line and the second bit line to determine a logic state stored in the magnetically sensitive resistors corresponding to the cell.

16. The MRAM device as defined in claim 15, wherein at least one other pair of bit lines is coupled to a different number of resistors in a first portion and in a second portion than another pair of bit lines.

17. A method of determining a magnetic state in a magnetoresistive random access memory (MRAM) cell comprising:
   resetting an interface circuit such that an output of the interface circuit is reset;
   comparing an amount of resistance in a first portion of a first bit line to an amount of resistance in a first portion of a second bit line, where the first bit line and the second bit line correspond to the MRAM cell;
   comparing an amount of resistance in a second portion of the first bit line to an amount of resistance in a second portion of the second bit line; and
   generating an output with a logic state corresponding to the magnetic state stored in the cell based on the comparisons of the amount of resistance.

18. The method as defined in claim 17, further comprising selectively activating a word line to select the MRAM cell.

19. A method of latching a magnetic state in a magnetoresistive random access memory (MRAM) cell comprising:
   selectively activating a word line corresponding to the MRAM cell;
   in a reset state, neutralizing cross-coupled feedback of an interface circuit to allow the interface circuit to balance in response to current applied through first and second portions of a first bit line and through first and second portions of a second bit line, where the first bit line corresponds to the MRAM cell; and
   in a latched state, enabling cross-coupled feedback across the interface circuit so that an imbalance in resistance from a stored state of the MRAM cell latches the interface circuit in a corresponding logical state.

* * * * *